US012648140B2

(12) United States Patent
Kang

(10) Patent No.: US 12,648,140 B2
(45) Date of Patent: Jun. 2, 2026

(54) THREE-DIMENSIONAL MEMORY DEVICE

(71) Applicant: SK hynix Inc., Icheon-si (KR)

(72) Inventor: Chang Woo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 582 days.

(21) Appl. No.: 18/184,168

(22) Filed: Mar. 15, 2023

(65) Prior Publication Data

US 2024/0147720 A1     May 2, 2024

(30) Foreign Application Priority Data

Oct. 31, 2022    (KR) ......................... 10-2022-0142182

(51) Int. Cl.
*H10B 43/27* (2023.01)
*H10B 41/10* (2023.01)
*H10B 41/27* (2023.01)
*H10B 43/10* (2023.01)
*H10W 20/41* (2026.01)
*H10W 20/42* (2026.01)

(52) U.S. Cl.
CPC ............. *H10B 43/27* (2023.02); *H10B 41/10* (2023.02); *H10B 41/27* (2023.02); *H10B 43/10* (2023.02); *H10W 20/42* (2026.01); *H10W 20/435* (2026.01)

(58) Field of Classification Search
CPC ....................................................... H10B 43/27
See application file for complete search history.

(56) References Cited

U.S. PATENT DOCUMENTS 9,978,752 B2     5/2018  Kim et al.
2017/0207221 A1  7/2017  Kim et al.
2017/0207238 A1* 7/2017  Lee ...................... H10D 30/696

FOREIGN PATENT DOCUMENTS

KR     10-2018-0106727  A     10/2018
KR     10-2020-0074303  A     6/2020

* cited by examiner

*Primary Examiner* — Christopher A Johnson

(57) ABSTRACT

A three-dimensional memory device may include a lower electrode structure including a plurality of lower electrodes which are vertically stacked on a substrate; a plurality of upper electrode structures disposed on the lower electrode structure, and each including a plurality of upper electrodes which are vertically stacked; and a plurality of shunt structures passing through the plurality of upper electrode structures, and each electrically coupling the plurality of upper electrodes included in the upper electrode structure.

20 Claims, 18 Drawing Sheets

THREE-DIMENSIONAL MEMORY DEVICE

CROSS-REFERENCE TO RELATED APPLICATION

The present application claims priority under 35 U.S.C. § 119(a) to Korean Patent Application No. 10-2022-00142182 filed in the Korean Intellectual Property Office on Oct. 31, 2022, which is incorporated herein by reference in its entirety.

BACKGROUND

1. Technical Field

Various embodiments generally relate to a semiconductor technology, and more particularly, to a three-dimensional memory device.

2. Related Art

A memory device with a two-dimensional or planar structure has been developed to store more data in the same area by using a fine patterning process. However, as the line width of a circuit is narrowed due to the demand for high integration, interference between memory cells becomes severe, thereby causing various limitations such as degradation in performance. Of course, in addition to such structural limitations, there is a problem in that an increase in manufacturing cost is inevitable because expensive equipment is required to pattern a fine line width.

As an alternative to overcome such limitations of the two-dimensional memory device, a three-dimensional memory device has been proposed. A three-dimensional memory device has advantages in that a larger capacity may be realized within the same area by increasing the number of stacks through vertically stacking memory cells, thereby providing high performance and excellent power efficiency.

In a three-dimensional memory device, the degree of integration may be increased by increasing the number of electrode layers (word lines) to be stacked. In order to apply an electrical signal to the electrode layers disposed at different heights, contacts are coupled to the electrode layers. If the size of a pad portion of the electrode layer coupled to the contact is small, a process margin becomes insufficient during a contact forming process, resulting in a contact coupling failure.

SUMMARY

Various embodiments are directed to a three-dimensional memory device capable of preventing or suppressing a contact coupling failure.

Various embodiments are directed to a three-dimensional memory device capable of contributing to size reduction.

In an embodiment, a three-dimensional memory device may include: a lower electrode structure including a plurality of lower electrodes that are vertically stacked on a substrate; a plurality of upper electrode structures disposed on the lower electrode structure, and each including a plurality of upper electrodes that are vertically stacked; and a plurality of shunt structures passing through the plurality of upper electrode structures, and each electrically coupling the plurality of upper electrodes included in the upper electrode structure.

In an embodiment, a three-dimensional memory device may include: a lower electrode structure including a plurality of lower electrodes, which are vertically stacked on a substrate; and a plurality of upper electrode structures disposed on the lower electrode structure, and each including a plurality of upper electrodes which are vertically stacked and are electrically coupled to each other, wherein some of the plurality of upper electrodes include pad portions, and other upper electrodes in the plurality of upper electrodes do not include a pad portion.

In an embodiment, a three-dimensional memory device may include: a substrate having a cell region and a slimming region extending from the cell region in a first direction; a lower electrode structure including a plurality of word lines which are vertically stacked on the substrate; a plurality of upper electrode structures disposed on the lower electrode structure, and each including a plurality of select lines that are vertically stacked; and a plurality of shunt structures passing through the plurality of upper electrode structures, each electrically coupling the plurality of select lines of the upper electrode structure.

DETAILED DESCRIPTION

Figure 1:
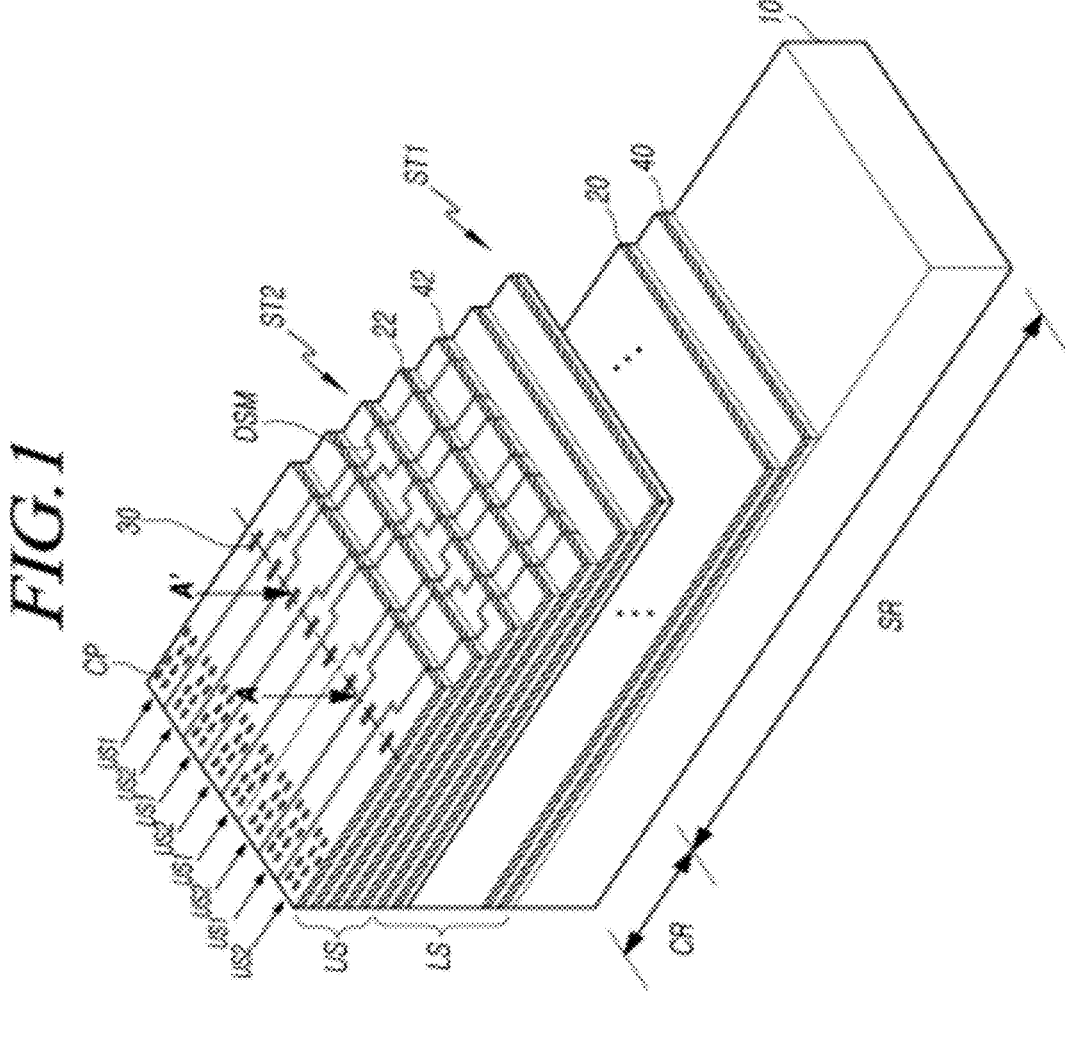
FIG. 1 is an exemplary perspective view of a three-dimensional memory device according to an embodiment of the disclosure.

Advantages and features of the disclosure and methods to achieve them will become apparent from the descriptions of exemplary embodiments herein below with reference to the accompanying drawings. However, the present disclosure is not limited to the exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

Since the figures, dimensions, ratios, angles, numbers of elements given in the drawings to describe embodiments of the disclosure are merely illustrative, the present disclosure is not limited to the illustrated matters. Throughout the specification, like reference numerals refer to like components. In describing the disclosure, when it is determined that the detailed description of the related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise.

In interpreting elements in embodiments of the disclosure, they should be interpreted as including error margins even without explicit statements.

Also, in describing the components of the disclosure, there may be used terms such as first, second, A, B, (a), and (b). These are solely for the purpose of differentiating one component from another component but do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationships, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other. In the drawings, a direction indicated by an arrow and a direction opposite thereto indicate the same direction.

Hereinafter, various examples of embodiments of the present disclosure will be described in detail with reference to the accompanying drawings.

Figure 2:
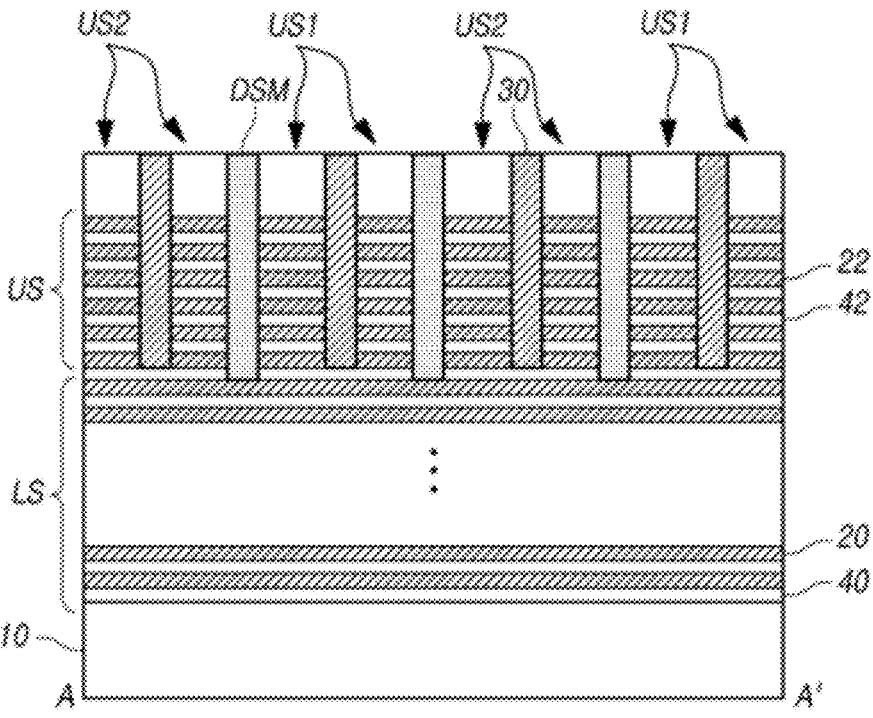
FIG. 2 is a cross-sectional view taken along the line A-A' of FIG. 1.

FIG. 1 is an exemplary perspective view of a three-dimensional memory device according to an embodiment of the disclosure, and FIG. 2 is a cross-sectional view taken along the line A-A' of FIG. 1.

Referring to FIGS. 1 and 2, a lower electrode structure LS may be disposed on a substrate 10, a plurality of upper electrode structures US may be disposed on the lower electrode structure LS, and a shunt structure 30 may be formed in each upper electrode structure US.

In more detail, the lower electrode structure LS may include a plurality of lower electrodes 20, which are vertically stacked. Also, the lower electrode structure LS may include a plurality of lower dielectric layers 40, which are disposed alternately with the plurality of lower electrodes 20. As illustrated in FIG. 1, the lower electrode structure LS may extend from a cell region CR to a slimming region SR in the first direction FD.

A first stairway structure ST1 may be formed on the lower electrode structure LS. The first stairway structure ST1 may have a stairway shape, which descends in the first direction FD.

End portions of the lower electrodes 20 may be positioned in the first stairway structure ST1. The end portion of the lower electrode 20 positioned in the first stairway structure ST1 may configure a pad portion.

Although not illustrated, a contact may be coupled to the pad portion of the lower electrode 20. An electrical signal (e.g., an operating voltage) may be applied to the lower electrode 20 through the contact coupled to the pad portion.

The plurality of upper electrode structures US may extend from the cell region CR to the slimming region SR in the first direction FD, and may be arranged in the second direction SD. In order to expose the first stairway structure ST1 in the first direction FD, the upper electrode structures US may have a shorter length than the lower electrode structure LS.

The upper electrode structures US may include a plurality of upper electrodes 22, which are vertically stacked. Also, the upper electrode structures US may include a plurality of upper dielectric layers 42, which are disposed alternately with the plurality of upper electrodes 22.

An isolation pattern DSM may be disposed between adjacent upper electrode structures US. The isolation pattern DSM may include a dielectric material. Adjacent upper electrode structures US from each other may be insulated by the isolation pattern DSM.

The upper electrode structures US may have a second stairway structure ST2. The second stairway structure ST2 may be disposed in the slimming region SR, and may have a stair shape, which descends in the first direction FD. End portions of the upper electrodes 22 and of the adjacent upper dielectric layers 42 disposed under the upper electrodes 22 may be positioned as steps in the second stairway structure ST2. The end portion of an upper electrode 22 positioned in the second stairway structure ST2 may configure a pad portion. The end portion of an upper electrode 22 positioned in the second stairway structure ST2 may be a horizontal part of a step, and the edges of the upper electrode 22 and adjacent upper dielectric layer 42 underneath may be a vertical part of the step. The vertical part is arranged in the first direction FD to expose the horizontal part of the next lowermost upper electrode 22.

In the cell region CR, a plurality of cell plugs CP, which extend to the substrate 10 by vertically passing through the upper electrode structures US and the lower electrode structure LS, may be formed.

At least one of the lower electrodes 20 from the lower end of the lower electrode structure LS may configure a first select line. Lower electrodes 20, which are disposed on the first select line may configure word lines. The upper electrodes 22 may configure second select lines. The first select line may be a source select line, and the second select lines may be drain select lines.

A source select transistor may be configured in areas or regions where the source select line surrounds the cell plug CP. A memory cell may be configured in areas or regions where the word line surrounds the cell plug CP. A drain select transistor may be configured in areas or regions where the drain select line surrounds the cell plug CP. At least one source select transistor, a plurality of memory cells and a plurality of drain select transistors may be disposed along one cell plug CP in the vertical direction VD to configure one cell string.

The shunt structure 30 may vertically pass through the upper electrodes 22 and the upper dielectric layers 42 of the upper electrode structures US, and may be coupled to the upper electrodes 22.

The shunt structure 30 may be formed of a conductive material. The upper electrodes 22 of the upper electrode structure US may be electrically coupled to each other by the shunt structure 30.

The shunt structure 30 may not pass through the lowermost upper dielectric layer 42 from among the upper dielectric layers 42 of the upper electrode structures US. The lowermost upper dielectric layer 42 may insulate the shunt structure 30 from the lower electrode structure LS.

Figure 3:
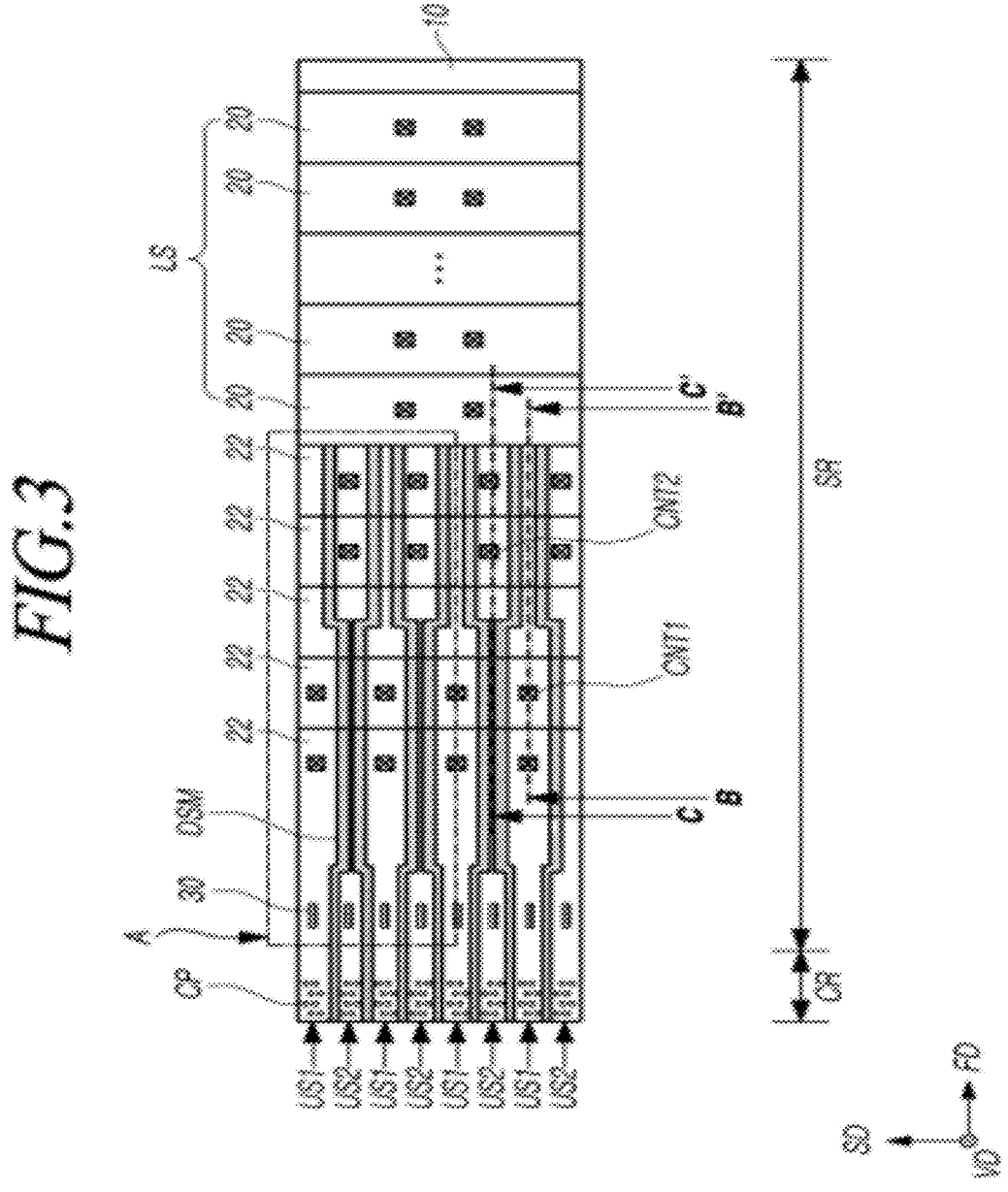
FIG. 3 is a top view illustrating a three-dimensional memory device according to an embodiment of the disclosure.
Figure 4:
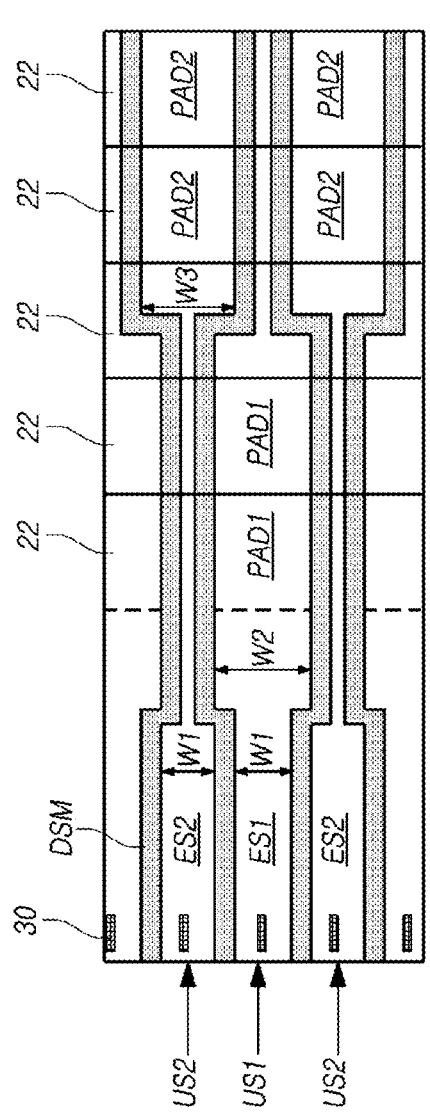
FIG. 4 is a partial enlarged top view of part A of FIG. 3.
Figure 4:
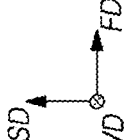
Figure 5:
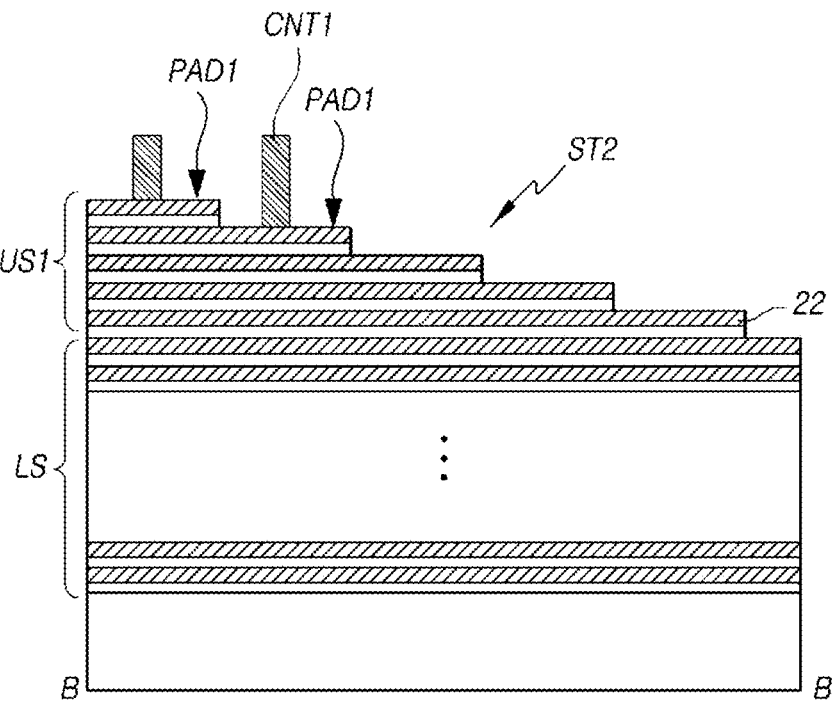
FIG. 5 is a cross-sectional view taken along the line B-B' of FIG. 3.
Figure 6:
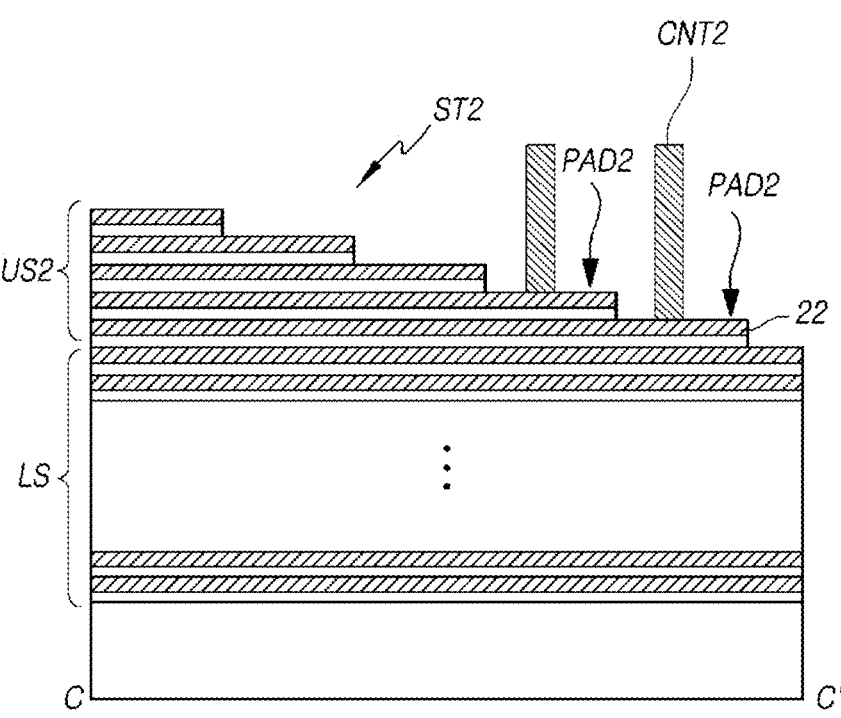
FIG. 6 is a cross-sectional view taken along the line C-C' of FIG. 3.

FIG. 3 is a top view illustrating a three-dimensional memory device according to an embodiment of the disclosure, FIG. 4 is a partial enlarged top view of part A of FIG. 3, FIG. 5 is a cross-sectional view taken along the line B-B' of FIG. 3, and FIG. 6 is a cross-sectional view taken along the line C-C' of FIG. 3.

For the sake of simplicity in illustration, first and second contacts CNT1 and CNT2 are not illustrated in FIG. 4.

Referring to FIGS. 3 and 4, a plurality of upper electrode structures may include a first upper electrode structure US1 and a second upper electrode structure US2. A plurality of first upper electrode structures US1 and a plurality of second upper electrode structures US2 may be provided. The plurality of first upper electrode structures US1 and the plurality of second upper electrode structures US2 may be alternately disposed in the second direction SD.

The first upper electrode structure US1 may include first electrode portions ES1 and first pad portions PAD1. The second upper electrode structure US2 may include second electrode portions ES2 and second pad portions PAD2.

The first electrode portions ES1 and the second electrode portions ES2 may be disposed in a cell region CR, and may extend from the cell region CR to a slimming region SR in the first direction FD. The first pad portions PAD1 and the second pad portions PAD2 may be disposed in the slimming region SR.

The number of first pad portions PAD1 included in the first upper electrode structure US1 may be less than the number of upper electrodes 22 included in the first upper electrode structure US1. Similarly, the number of second pad portions PAD2 included in the second upper electrode structure US2 may be less than the number of upper electrodes 22 included in the second upper electrode structure US2. FIGS. 3 and 4 illustrate five upper electrodes 22 included in each of the first upper electrode structure US1 and the second upper electrode structure US2 and two pad portions included in each of the first upper electrode structure US1 and the second upper electrode structure US2.

The width of the first electrode portion ES1 and the width of the second electrode portion ES2 may have a size of W1. The width of the first pad portion PAD1 may have a size of W2, which is larger than W1. The width of the second pad portion PAD2 may have a size of W3, which is larger than W1. W2 and W3 may be the same value or may be different values.

Referring to FIGS. 3, 5 and 6, a first contact CNT1 may be coupled to the first pad portion PAD1 and a second contact CNT2 may be coupled to the second pad portion PAD2. An electrical signal (e.g., an operating voltage) may be applied to the first pad portion PAD1 through the first contact CNT1, and an electrical signal (e.g., an operating voltage) may be applied to the second pad portion PAD2 through the second contact CNT2.

As described above with reference to FIGS. 1 and 2, since the upper electrodes 22 included in the first upper electrode structure US1 are electrically coupled to each other through a shunt structure 30, the electrical signal applied to the first pad portion PAD1 may be applied to all the upper electrodes 22 included in the first upper electrode structure US1 through the shunt structure 30. For the same reason, the electrical signal applied to the second pad portion PAD2 may be applied to all the upper electrodes 22 included in the second upper electrode structure US2 through a shunt structure 30.

Consequently, not all of the upper electrodes 22 are required to have pad portions, and it is possible to configure pad portions only in some of the upper electrodes 22.

If pad portions are configured in only some of the upper electrodes 22, then the number of pad portions may decrease compared to a case in which pad portions are configured in all of the upper electrodes 22. Therefore, each pad portion may be formed to have a larger size. If the size of the pad portion increases, then process margin is improved in a process of coupling a contact to the pad portion, whereby it is possible to prevent or suppress a contact coupling failure. Referring to FIGS. 5 and 6, the first pad portions PAD1 and the second pad portions PAD2 may be disposed in a second stairway structure ST2.

In the first upper electrode structure US1, the first pad portions PAD1 may be configured at some of the ends of the upper electrodes 22 configuring the second stairway structure ST2. Some of the upper electrodes 22 of the first upper electrode structure US1 may include the first pad portions PAD1, and some upper electrodes 22 do not include pad portions.

For example, FIG. 5 illustrates that, among the five upper electrodes 22 included in the first upper electrode structure US1, two upper electrodes 22 disposed in an upper part include first pad portions PAD1 and the remaining three upper electrodes 22 do not include pad portions.

In the second upper electrode structure US2, the second pad portions PAD2 may be configured at some of the ends of the upper electrodes 22 configuring the second stairway structure ST2. That is to say, some of the upper electrodes 22 of the second upper electrode structure US2 may include the second pad portions PAD2, and some other upper electrodes 22 may not include pad portions.

For example, FIG. 6 illustrates that, among the five upper electrodes 22 included in the second upper electrode structure US2, two upper electrodes 22 disposed in a lower part include the second pad portions PAD2 and the remaining three upper electrodes 22 do not include pad portions.

The upper electrodes 22 including the first pad portions PAD1 and the upper electrodes 22 including the second pad portions PAD2 may be disposed at different heights, in the vertical direction VD, from the top surface of the substrate 10.

Referring to FIGS. 4 to 6, among the end portions of the upper electrodes 22 of the first upper electrode structure US1 and the end portions of the upper electrodes 22 of the second upper electrode structure US2, end portions that are disposed in one column in the second direction SD are positioned at the same height as each other from the top surface of the substrate 10. In comparative examples, if the first pad portion PAD1 and the second pad portion PAD2 are configured in upper electrodes 22 that are positioned at the same vertical level from the top surface of the substrate 10, and if the first pad portion PAD1 and the second pad portion PAD2 are disposed in the same column, then it is impossible to simultaneously increase the width, in the second direction SD, of the second pad portion PAD2 while also increasing the width of the first pad portion PAD1.

In contrast, in disclosed embodiments, by configuring the first pad portion PAD1 and the second pad portion PAD2 in upper electrodes 22 that are vertically positioned at different heights and by disposing the first pad portion PAD1 and the second pad portion PAD2 in different columns, it is possible to increase, in the second direction SD, both the width W2 of the first pad portion PAD1 and the width W3 of the second pad portion PAD2.

Referring back to FIG. 4, in a plan view, an isolation pattern DSM has a bent portion or dogleg. In FIG. 4, the bent portion is located in an end portion of an upper electrode 22 between a first pad portion PAD1 and a second pad portion PAD2, which are adjacent to the end portion of the upper electrode 22 in the first direction FD. Since the width of the first and second pad portions PAD1 and PAD2 is larger than the width of the first and second electrode portions ES1 and ES2 in the second direction SD, and because the first pad portion PAD1 and the second pad portion PAD2 are disposed in different columns, the isolation pattern DSM has a bent portion between a first pad portion PAD1 and an adjacent second pad portion PAD2. For example, the bent portion of the isolation pattern DSM disposed between the first pad portion PAD1 and the second pad portion PAD2, which are adjacent to each other, may be designed to be disposed on a horizontal part of a step in the second stairway structure ST2.

In another example, as will be described below with reference to FIGS. 7 and 8, while the bent portion of the isolation pattern DSM is disposed in the first direction FD between a first pad portion PAD1 and an adjacent second pad portion PAD2, the dogleg is arranged at the edge of a step in the second stairway structure ST2. As a result, the bent portion may be designed to be disposed on a vertical part of a step in the second stairway structure ST2, so that a greater range of adjustments can be made to the horizontal part.

Figure 7:
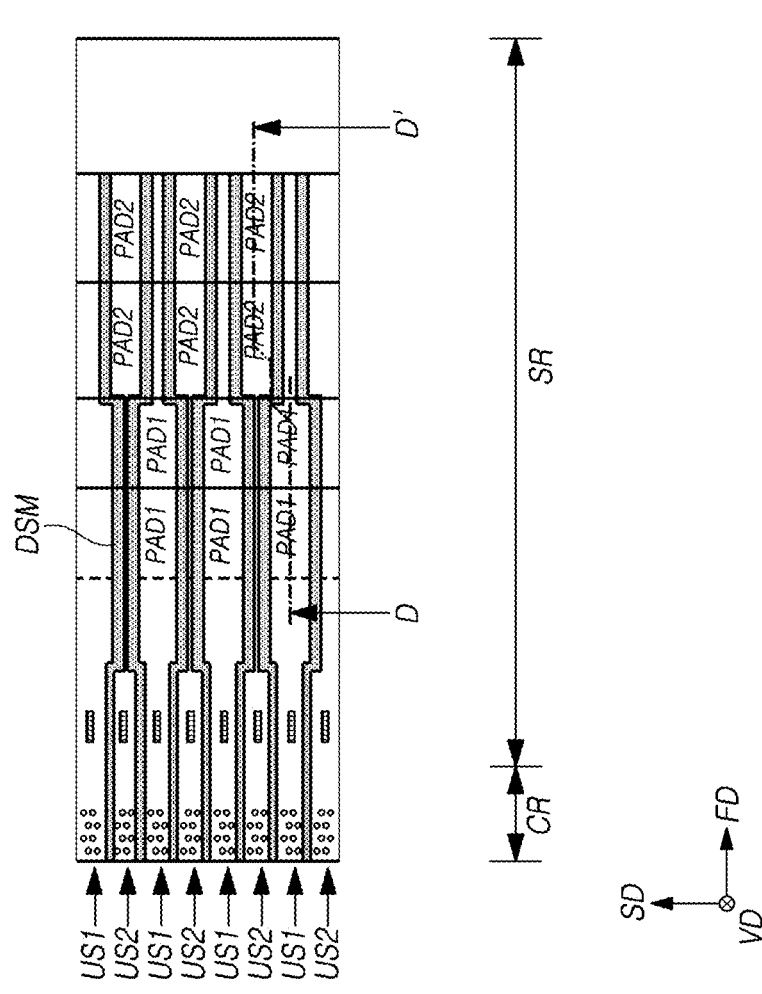
FIG. 7 is a top view illustrating a three-dimensional memory device according to an embodiment of the disclosure.
Figure 8:
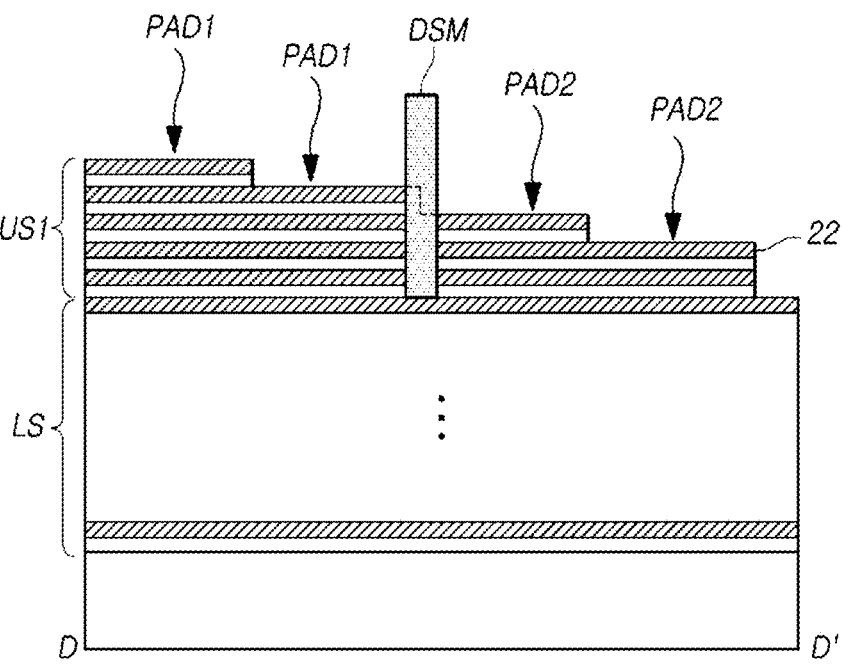
FIG. 8 is a cross-sectional view taken along the line D-D' of FIG. 7.

FIG. 7 is a top view illustrating a three-dimensional memory device according to an embodiment of the disclosure, and FIG. 8 is a cross-sectional view taken along the line D-D' of FIG. 7.

Referring to FIGS. 7 and 8, a bent portion of an isolation pattern DSM disposed between a first pad portion PAD1 and an adjacent second pad portion PAD2 may be disposed on a vertical part of a step in a second stairway structure ST2.

If, as described with reference to FIG. 4 above, the bent portion of the isolation pattern DSM is disposed between the first pad portion PAD1 and the adjacent second pad portion PAD2, but on the horizontal part of the second stairway structure ST2, then because the bent portion of the isolation pattern DSM occupies the horizontal part of the second stairway structure ST2, there is not enough area for the horizontal part to be used as a pad portion unless the area is increased.

Therefore, in FIG. 4, since a horizontal part is used for disposing the bent portion of the isolation pattern DSM must be further configured to serve as a pad portion, a total layout area may increase.

As illustrated in FIGS. 7 and 8, however, when the bent portion of the isolation pattern DSM disposed between the first pad portion PAD1 and the adjacent second pad portion PAD2 is disposed on the vertical part of a step of the second stairway structure ST2, since the bent portion of the isolation pattern DSM does not occupy a horizontal part of the step, it is possible to reduce the number of stairs of the second stairway structure ST2 and/or decrease the total layout area consumed by the second stairway structure ST2.

Referring to FIG. 7, when viewed from the top, the first pad portions PAD1 of a first upper electrode structure US1 may be continuously or sequentially disposed in the first direction FD. From a top view, the second pad portions PAD2 of a second upper electrode structure US2 may be continuously or sequentially disposed in the first direction FD.

As illustrated in FIG. 8, among upper electrodes 22 of the first upper electrode structure US1, upper electrodes 22 including the first pad portions PAD1 are sequentially disposed in the vertical direction. Among upper electrodes 22 of the second upper electrode structure US2, upper electrodes 22 including the second pad portions PAD2 are also sequentially disposed in the vertical direction.

In comparative example, if the first pad portions PAD1 of the first upper electrode structure US1 and the second pad portions PAD2 of the second upper electrode structure US2 are alternately disposed in the first direction, then the number of the bent portions of the isolation pattern DSM must increase. The area occupied by the bent portions of the isolation pattern DSM results in an overall increase layout area and device size.

By grouping the first pad portions PAD1 of the first upper electrode structure US1 in the first direction FD and grouping the second pad portions PAD2 of the second upper electrode structure US2 in the first direction FD, the number of the bent portions of the isolation pattern DSM may be reduced, and layout area consumption may be decreased to reduce device size.

Meanwhile, as will be described below with reference to FIGS. 9 and 10, a first pad portion PAD1 and a second pad portion PAD2 may be configured on only upper electrodes 22 of uppermost layers, and may not be configured on upper electrodes 22 other than the upper electrodes 22 of the uppermost layers.

Figure 9A:
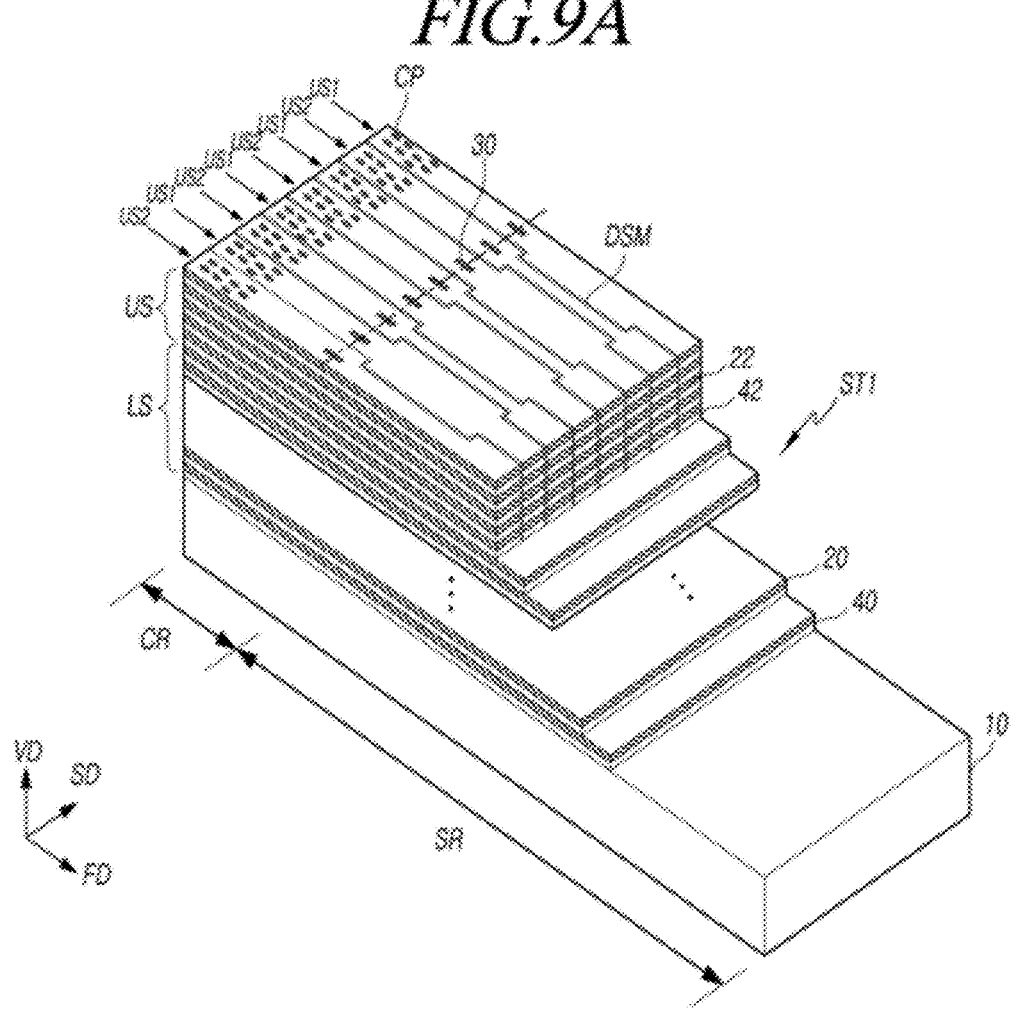
FIG. 9A is a perspective view illustrating another example of a 3D memory device according to the disclosure.
Figure 9B:
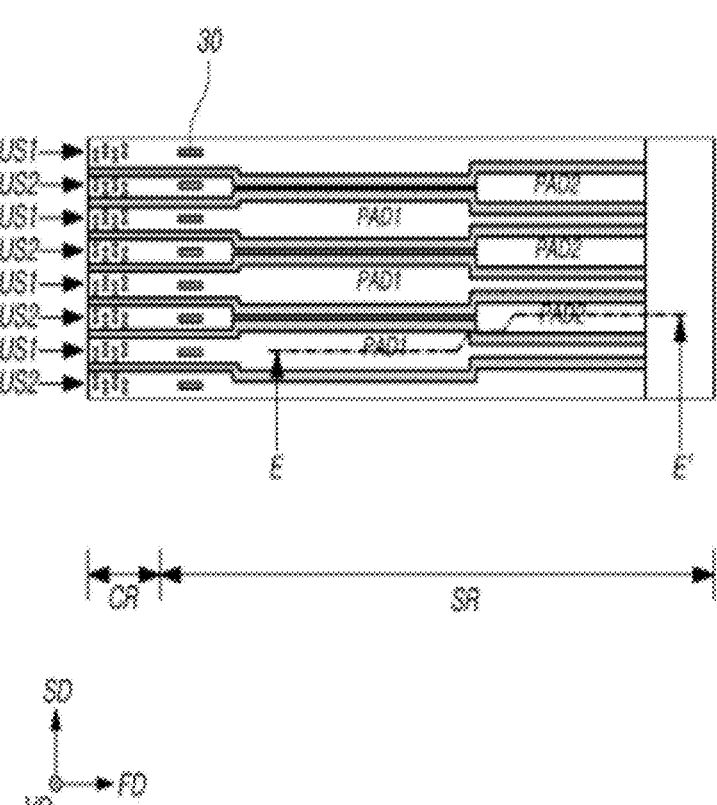
FIG. 9B is a top view illustrating a three-dimensional memory device according to an embodiment of the disclosure.

FIG. 9A is a perspective view illustrating another example of a 3D memory device according to the disclosure. FIG. 9B is a top view illustrating a three-dimensional memory device according to an embodiment of the disclosure, and FIG. 10 is a cross-sectional view taken along the line E-E' of FIG. 9B.

Figure 10:
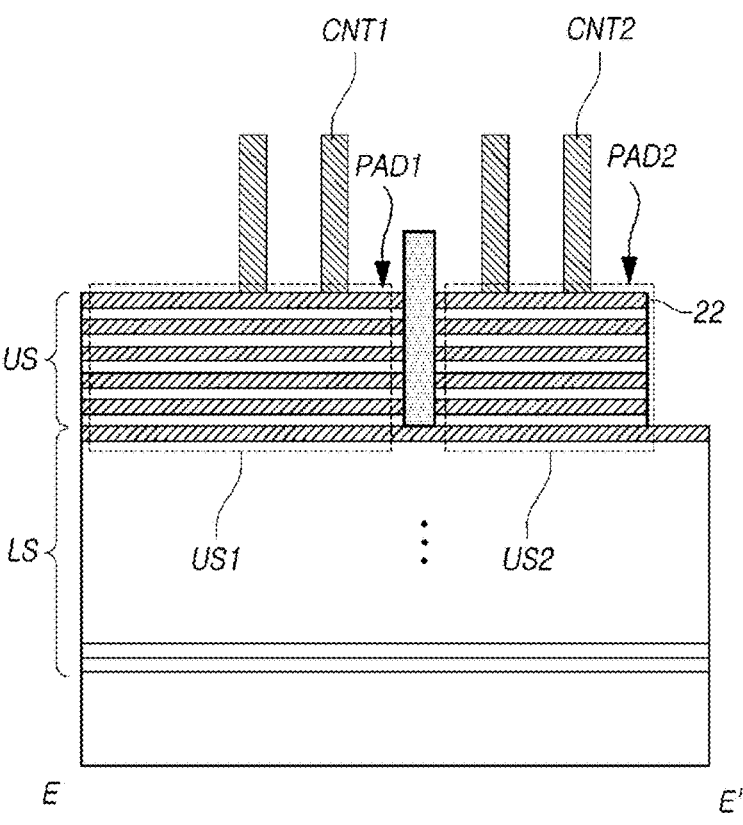
FIG. 10 is a cross-sectional view taken along the line E-E' of FIG. 9.

Referring to FIGS. 9A, 9B and 10, a first pad portion PAD1 may be configured on only an upper electrode 22 of an uppermost layer among upper electrodes 22 of a first upper electrode structure US1. Other upper electrodes 22 of the first upper electrode structure US1, other than the upper electrode 22 of the uppermost layer, do not include a first pad portion PAD1.

A second pad portion PAD2 may be configured on only an upper electrode 22 of an uppermost layer among upper electrodes 22 of a second upper electrode structure US2. Other upper electrodes 22 of the second upper electrode structure US2, other than the upper electrode 22 of the uppermost layer, do not include a second pad portion PAD2.

A first contact CNT1 may be coupled to the first pad portion PAD1 and a second contact CNT2 may be coupled to the second pad portion PAD2. An electrical signal (e.g., an operating voltage) may be applied to the first pad portion PAD1 through the first contact CNT1, and an electrical signal (e.g., an operating voltage) may be applied to the second pad portion PAD2 through the second contact CNT2.

As described above with reference to FIG. 1, an end portion of a lower electrode structure LS in the first direction FD may have a stairway shape. Unlike that structure, as illustrated in FIGS. 9A, 9B and 10, end portions of the first and second upper electrode structures US1 and US2 in the first direction FD do not have stairway structures. For example, the end portions of the first and second upper electrode structures US1 and US2 in the first direction FD may have vertical wall shapes. The first and second upper electrode structures US1 and US2 may have non-stairway structures.

As described above with reference to FIGS. 3 to 6, the upper electrodes 22 included in the first upper electrode structure US1 are electrically coupled to each other through a shunt structure 30, and the upper electrodes 22 included in the second upper electrode structure US2 are electrically coupled to each other through a shunt structure 30. Therefore, even though the first pad portion PAD1 is configured on only the upper electrode 22 of the uppermost layer among the upper electrodes 22 of the first upper electrode structure US1 and is not configured on the other upper electrodes 22 of the first upper electrode structure US1, and even though the second pad portion PAD2 is configured on only the upper electrode 22 of the uppermost layer among the upper electrodes 22 of the second upper electrode structure US2 and is not configured on the other upper electrodes 22 of the second upper electrode structure US2, an electrical signal may be applied to all the upper electrodes 22.

Since it is not necessary to configure pad portions on the upper electrodes 22 under the upper electrodes 22 of the uppermost layers, it is possible to omit stairway structures that configure pad portions on the upper electrodes 22 under the upper electrodes 22 of the uppermost layers. Therefore, layout area consumption due to stairway structures may be eliminated, and thus, it is possible to reduce a size of a device.

It was described in the above embodiments that the shunt structure 30 is disposed in the electrode portion ES1 or ES2, but the disclosed technology is not limited thereto. The shunt structure 30 may be disposed in the pad portions PAD1 or PAD2.

Figure 11:
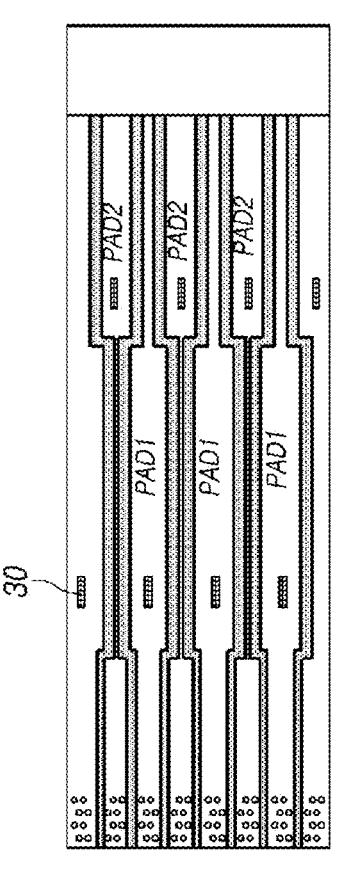
FIGS. 11 and 12 are top views illustrating three-dimensional memory devices according to an embodiment of the disclosure.
Figure 11:
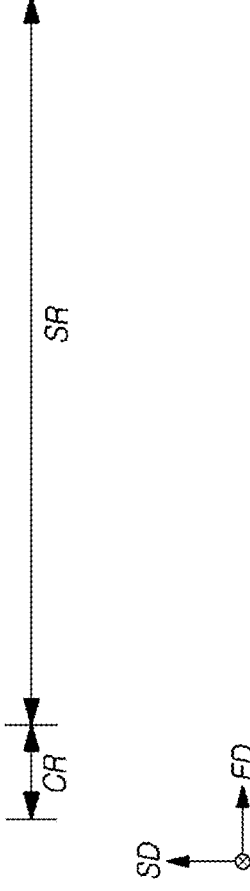
Figure 12:
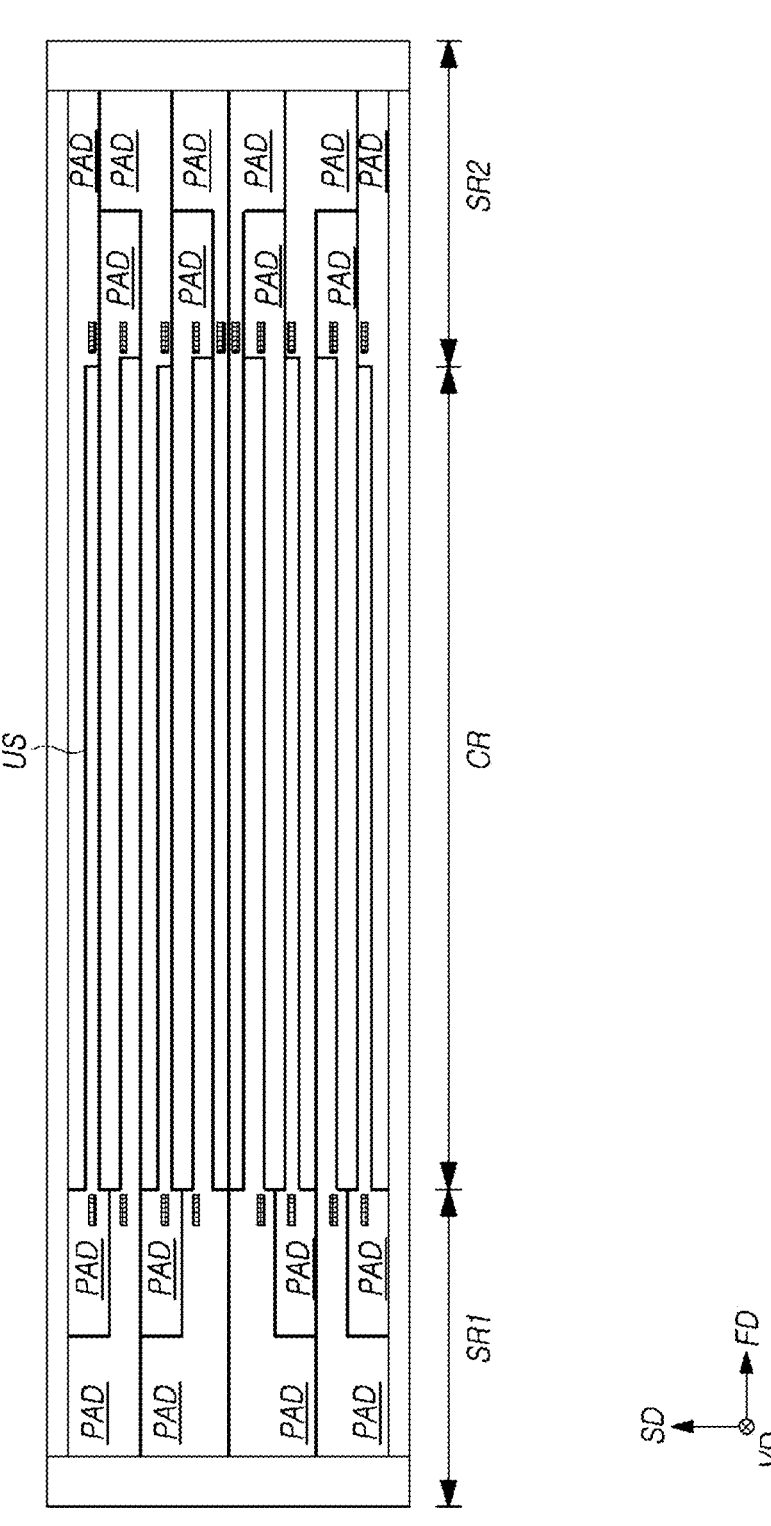

FIGS. 11 and 12 are top views illustrating three-dimensional memory devices according to an embodiment of the disclosure.

Referring to FIG. 11, shunt structures 30 may be disposed in pad portions PAD1 and PAD2.

As described above, since the width in the second direction SD of the pad portions PAD1 and PAD2 is larger than the width of electrode portions ES1 and ES2, when the shunt structures 30 are disposed in the pad portions PAD1 and PAD2, the distance between the shunt structure 30 and another adjacent upper electrode structure may be increased, and thus, it is possible to reduce the occurrence of a failure in which the shunt structure 30 is short-circuited with the other adjacent upper electrode structure.

It was described in the above embodiments in connection with the accompanying drawings that all the shunt structures 30 are disposed in the electrode portions ES1 and ES2 or all the shunt structures 30 are disposed in the pad portions PAD1 and PAD2, but the disclosed technology is not limited thereto. At least one of the shunt structures 30 may be disposed in an electrode portion, or at least one of the shunt structures 30 may be disposed in a pad portion.

Referring to FIG. 12, a three-dimensional memory device may include a cell region CR and a first slimming region SR1 and a second slimming region SR2, which are disposed on both sides of the cell region CR in the first direction FD.

Pad portions PAD of upper electrode structures US may be grouped into a first group and a second group to be disposed in the first slimming region SR1 and the second slimming region SR2, respectively.

In each of the first slimming region SR1 and the second slimming region SR2, pad portions PAD may be disposed in a plurality of columns.

By distributing the pad portions PAD in the first and second slimming regions SR1 and SR2, the width of each pad portion PAD may be further increased, and thus, a process margin of a contact forming process may be improved, whereby it is possible to prevent or suppress a contact coupling failure.

Figure 13:
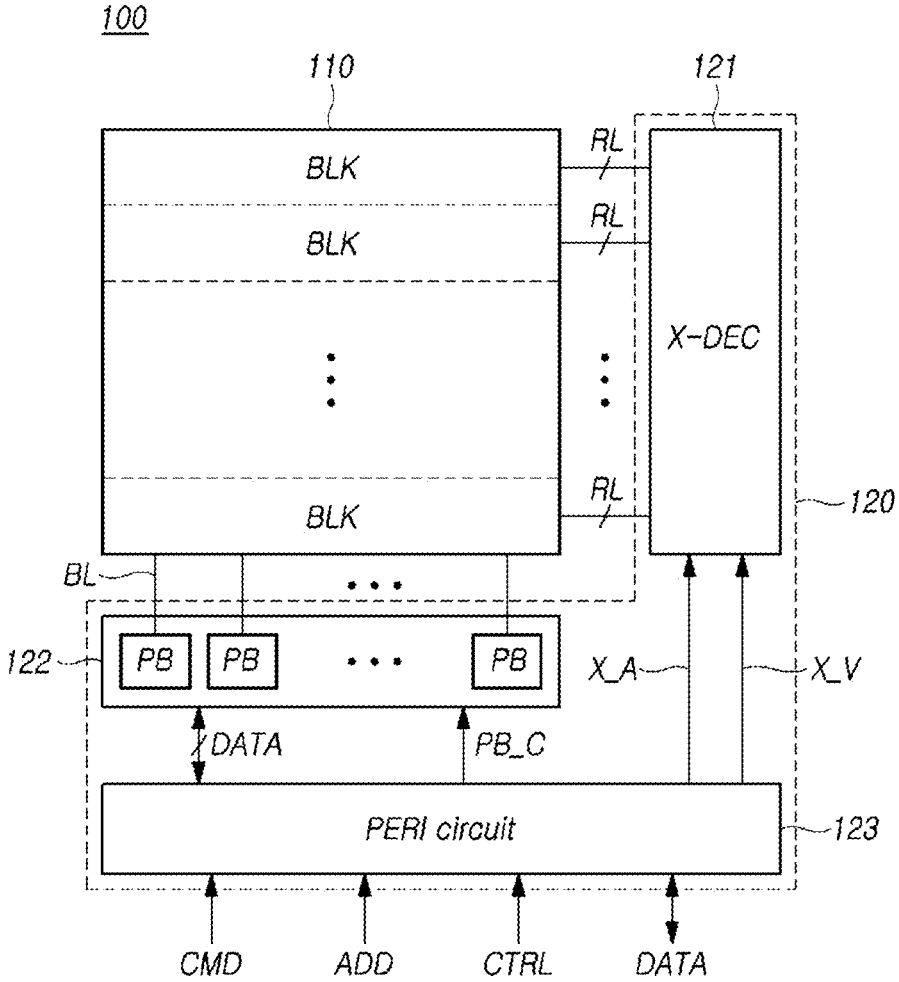
FIG. 13 is a block diagram of a three-dimensional memory device according to an embodiment of the disclosure.

FIG. 13 is a block diagram of a three-dimensional memory device according to an embodiment of the disclosure.

Referring to FIG. 13, a three-dimensional memory device 100 may include a memory cell array 110 and a logic circuit 120. The logic circuit 120 may include a row decoder (X-DEC) 121, a page buffer circuit 122 and a peripheral circuit (PERI circuit) 123.

The memory cell array 110 may be coupled to the row decoder 121 through a plurality of row lines RL, and may be coupled to the page buffer circuit 122 through a plurality of bit lines BL. The row lines RL may include a plurality of word lines and select lines. The select lines may include at least one source select line and a plurality of drain select lines.

The memory cell array 110 may include a plurality of memory cells, which are disposed at areas or regions where the plurality of bit lines BL and a plurality of word lines intersect with each other. The memory cell array 110 may include a plurality of memory blocks BLK. The memory block BLK may include a plurality of pages. A memory block BLK may be a basic unit of an erase operation, and a page may be a basic unit of a read operation.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected from among the memory blocks BLK included in the memory cell array 110. In order to transfer the operating voltage X_V, the row decoder 121 may include a pass transistor circuit including a plurality of pass transistors and a block switching circuit.

The page buffer circuit 122 may include a plurality of page buffers PB, which are coupled to the memory cell array 110 through the bit lines BL. The page buffer circuit 122 may receive a page buffer control signal PB_C from the peripheral circuit 123, and may transmit and receive a data signal DATA to and from the peripheral circuit 123.

The page buffer circuit 122 may control the bit lines BL, which are coupled to the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 according to the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data to or read data from a memory cell, which is coupled to a word line activated by the row decoder 121.

The peripheral circuit 123 may receive a command signal CMD, an address signal ADD and a control signal CTRL from a device outside the memory device 100, for example, a memory controller, and may transmit and receive data DATA to and from the device outside the memory device 100. The peripheral circuit 123 may output signals for writing data to the memory cell array 110 or reading data from the memory cell array 110, for example, a row address signal, a column address signal, the page buffer control signal PB_C and so forth, based on the command signal CMD, the address signal ADD and the control signal CTRL. The peripheral circuit 123 may generate various voltages including the operating voltage X_V, which are required in the memory device 100. For example, the peripheral circuit 123 may generate program voltages, pass voltages, read voltages and erase voltages of various levels.

The memory cell array 110 and the logic circuit 120 may be disposed in such a way to overlap each other in a vertical direction. The three-dimensional memory device 100 based on embodiments of the disclosed technology may be provided in a peripheral under cell (PUC) structure or a peripheral over cell (POC) structure.

Figure 14:
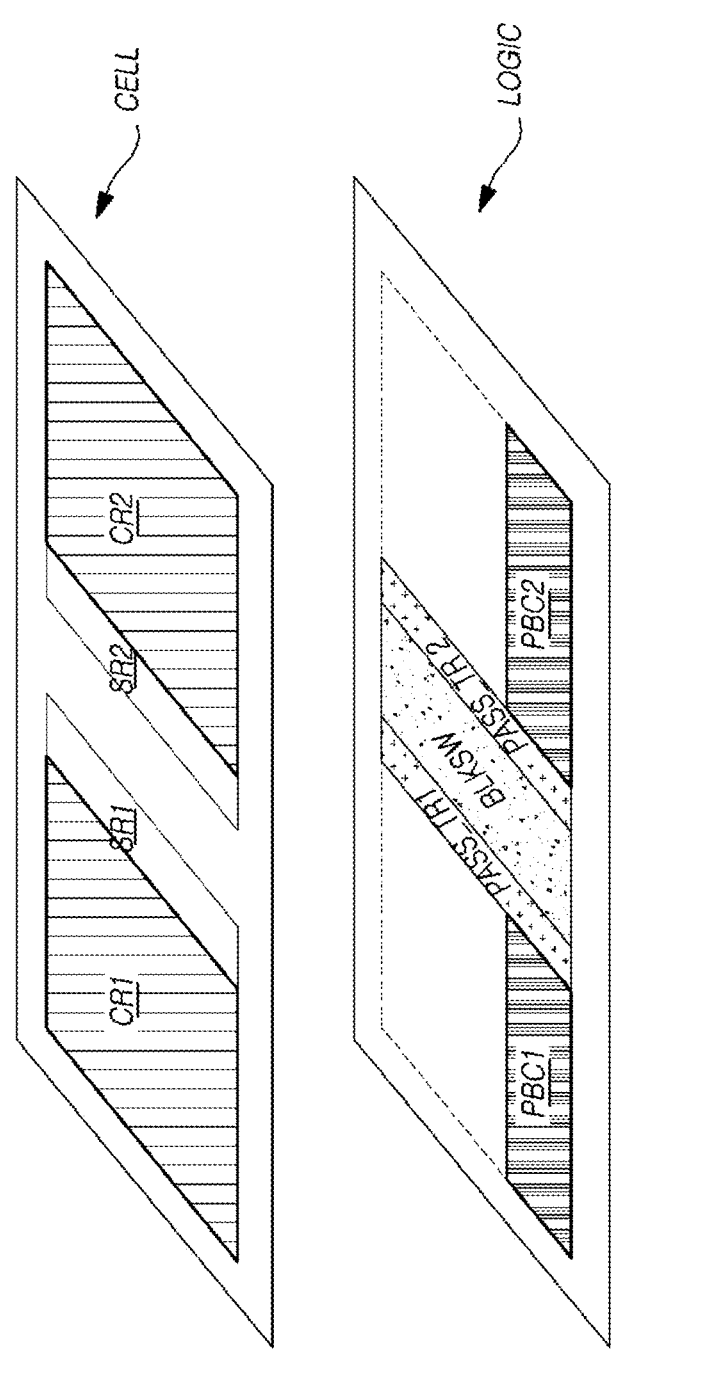
FIGS. 14 and 15 are diagrams illustrating schematic layouts of three-dimensional memory devices according to an embodiment of the disclosure.
Figure 14:
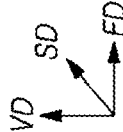
Figure 15:
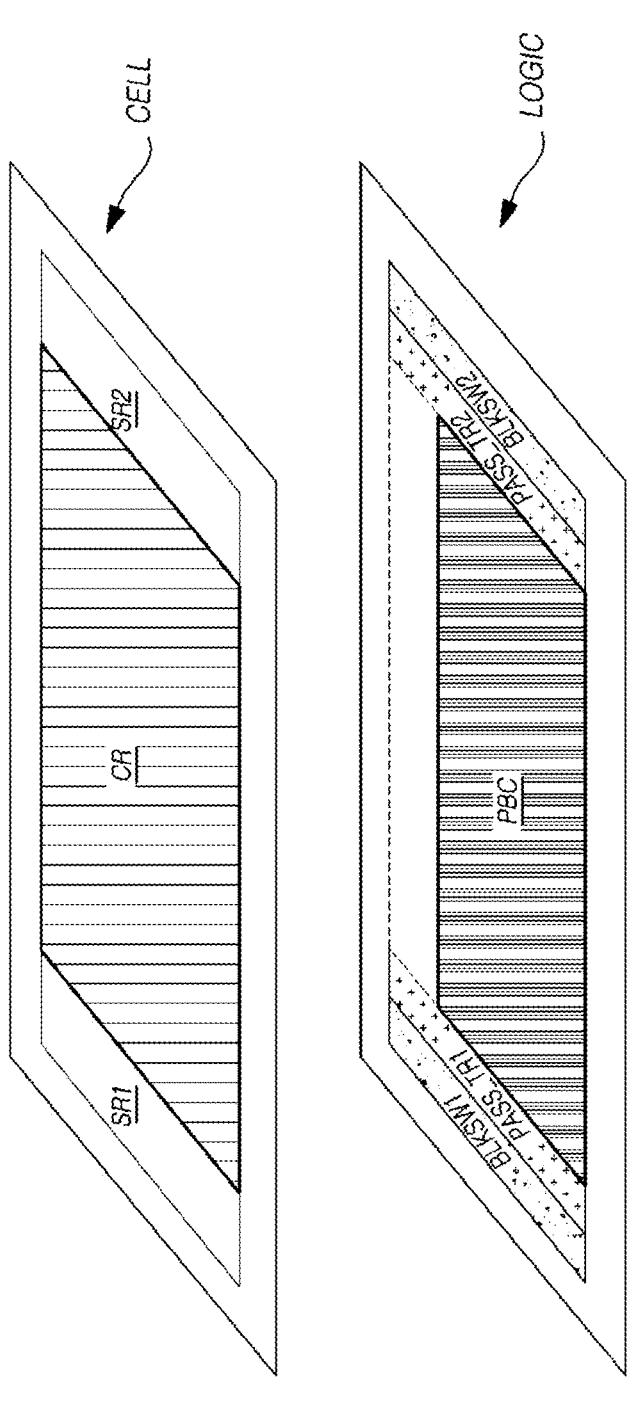
Figure 15:
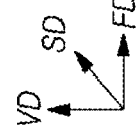

FIGS. 14 and 15 are diagrams illustrating schematic layouts of three-dimensional memory devices according to an embodiment of the disclosure.

Referring to FIG. 14, a three-dimensional memory device may include a logic structure LOGIC and a cell structure CELL, which is disposed on the logic structure LOGIC. Although FIG. 14 illustrates for the sake of convenience in explanation that the logic structure LOGIC and the cell structure CELL are separated from each other, it is to be understood that the upper surface of the logic structure LOGIC and the lower surface of the cell structure CELL contact each other.

After the logic structure LOGIC is formed on a substrate, the cell structure CELL may be built up on the logic structure LOGIC. In this case, the three-dimensional memory device may be defined as having a Peripheral Under Cell (PUC) structure.

However, after the logic structure LOGIC and the cell structure CELL are fabricated on different wafers, the logic structure LOGIC and the cell structure CELL may be combined through a wafer bonding process. In this case, the three-dimensional memory device may be defined as having a Peripheral Over Cell (POC) structure.

The cell structure CELL may include a memory cell array 110 of FIG. 13, and the logic structure LOGIC may include a logic circuit 120 of FIG. 13.

The memory cell array may be divided into a first memory group and a second memory group, which are disposed in a first cell region CR1 and a second cell region CR2, respectively.

The first cell region CR1 and the second cell region CR2 may be arranged in the first direction FD. Between the first cell region CR1 and the second cell region CR2, a first slimming region SR1 may be disposed to be adjacent to the first cell region CR1, and a second slimming region SR2 may be disposed to be adjacent to the second cell region CR2.

Although not illustrated, the lower electrode structure, the upper electrode structures and the shunt structures described above with reference to FIGS. 1 to 11 may be disposed in the first cell region CR1 and the first slimming region SR1. The pad portions of the lower electrode structure and the pad portions of the upper electrode structures may be disposed in the first slimming region SR1.

Similarly, the lower electrode structure, the upper electrode structures and the shunt structures may be disposed also in the second cell region CR2 and the second slimming region SR2. The pad portions of the lower electrode structure and the pad portions of the upper electrode structures may be disposed in the second slimming region SR2.

In order to reduce a delay time occurring in a process in which operating voltages from pass transistors included in a row decoder (see 121 of FIG. 13) of a logic circuit (see 120 of FIG. 13) are transferred to the pad portions, the pass transistors may be grouped into a first pass transistor group PASS_TR1 and a second pass transistor group PASS_TR2 to be disposed in a region overlapping the first slimming region SR1 and a region overlapping the second slimming region SR2, respectively.

A block decoder circuit BLKSW may be disposed between the first pass transistor group PASS_TR1 and the second pass transistor group PASS_TR2.

A page buffer circuit may be divided into a first page buffer group PBC1 and a second page buffer group PBC2 to be disposed in a region overlapping the first cell region CR1 of the cell structure CELL and a region overlapping the second cell region CR2 of the cell structure CELL, respectively.

From a top view, a structure may be defined as a centered X-DEC structure when the pass transistors PASS_TR1 and PASS_TR2 and the block decoder circuit BLKSW are disposed in a center region and the memory cell array and the page buffer circuit are divided each into two parts to be disposed on both sides of the pass transistors PASS_TR1 and PASS_TR2 and the block decoder circuit BLKSW.

From a top view, a memory cell array and a page buffer circuit may be disposed in a center region, and pass transistors and a block decoder circuit may be disposed on both sides of the memory cell array and the page buffer circuit.

Referring to FIG. 15, a memory cell array may be disposed in a cell region CR in a center region of a cell structure CELL. A first slimming region SR1 and a second slimming region SR2 may be disposed on both sides, respectively, of the cell region CR.

Although not illustrated, the lower electrode structure, the upper electrode structures and the shunt structures described above may be disposed in the cell region CR and the first and second slimming regions SR1 and SR2. The pad portions of the lower electrode structure may be disposed in a distributed manner in the first slimming region SR1 and the second slimming region SR2. The upper electrode structures may have, for example, a layout structure as illustrated in FIG. 12. As described above with reference to FIG. 12, the pad portions of the upper electrode structures may be disposed in a distributed manner in the first slimming region SR1 and the second slimming region SR2.

Pass transistors of a row decoder may be grouped into a first pass transistor group PASS_TR1 and a second pass transistor group PASS_TR2 to be disposed in a region overlapping the first slimming region SR1 and a region overlapping the second slimming region SR2, respectively. A first block decoder circuit BLKSW1, which controls the first pass transistor group PASS_TR1, may be disposed in a region adjacent to the first pass transistor group PASS_TR1, and a second block decoder circuit BLKSW2, which controls the second pass transistor group PASS_TR2, may be disposed in a region adjacent to the second pass transistor group PASS_TR2.

As such, a structure in which a memory cell array and a page buffer circuit are disposed in a center region and pass transistors and a block decoder circuit are disposed on both sides of the memory cell array and the page buffer circuit may be defined as a 2-sided X-DEC structure.

Figure 16:
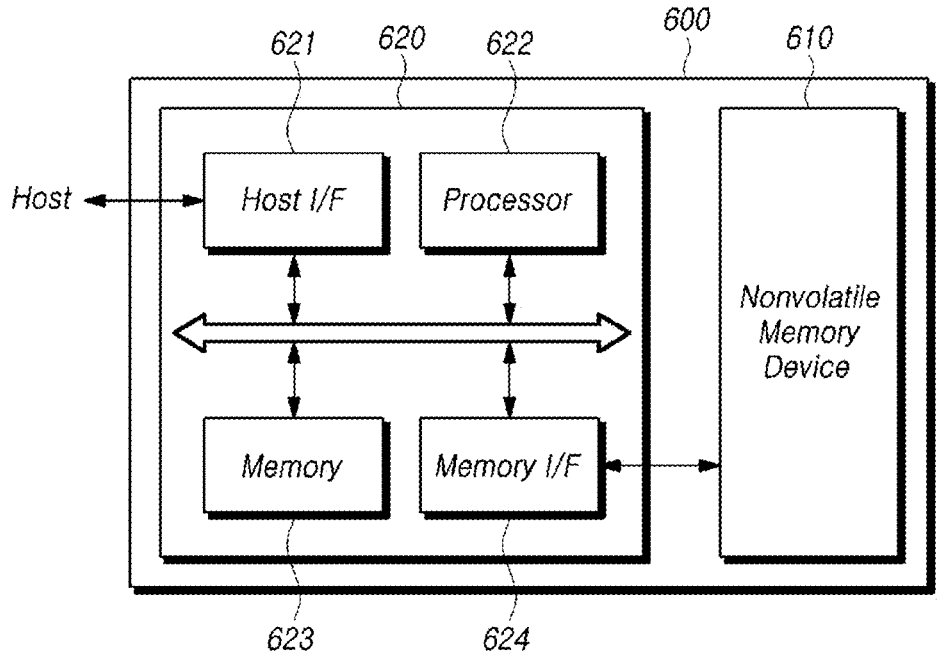
FIG. 16 is a block diagram schematically illustrating a memory system including a three-dimensional memory device according to an embodiment of the disclosure.

FIG. 16 is a block diagram schematically illustrating a memory system including a three-dimensional memory device according to an embodiment of the disclosure.

Referring to FIG. 16, a memory system 600 may store data to be accessed by a host such as a mobile phone, an MP3 player, a laptop computer, a desktop computer, a game machine, a TV, an in-vehicle infotainment system, and so forth.

The memory system 600 may be manufactured as any one of various kinds of storage devices according to the protocol of an interface which is electrically coupled with the host. For example, the memory system 600 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 600 may be manufactured as any one among various kinds of package types. For example, the memory system 600 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 600 may include a nonvolatile memory device 610 and a controller 620.

The nonvolatile memory device 610 may operate as a storage medium of the memory system 600. The nonvolatile memory device 610 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on the type of memory cells.

While FIG. 16 illustrates that the memory system 600 includes one nonvolatile memory device 610, this is only for the sake of convenience in explanation, and the memory system 600 may include a plurality of nonvolatile memory devices. The disclosed technology may be applied the same to the memory system 600 including a plurality of nonvolatile memory devices. The nonvolatile memory device 610 may include the three-dimensional memory device based on the embodiments of the disclosed technology.

The controller 620 may control general operations of the memory system 600 through driving of firmware or software loaded in a memory 623. The controller 620 may decode and drive a code type instruction or algorithm such as firmware or software. The controller 620 may be implemented in the form of hardware or in a combined form of hardware and software.

The controller 620 may include a host interface 621, a processor 622, the memory 623 and a memory interface 624. Although not illustrated in FIG. 16, the controller 620 may further include an ECC (error correction code) engine which generates a parity by ECC-encoding write data provided from the host and ECC-decodes read data, read from the nonvolatile memory device 610, by using the parity.

The host interface 621 may interface the host and the memory system 600 in correspondence to the protocol of the host. For example, the host interface 621 may communicate with the host through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 622 may be configured by a micro control unit (MCU) or a central processing unit (CPU). The processor 622 may process a request transmitted from the host. In order to process a request transmitted from the host, the processor 622 may drive a code type instruction or algorithm, that is, firmware, loaded in the memory 623, and may control the internal function blocks such as the host interface 621, the memory 623 and the memory interface 624 and the nonvolatile memory device 610.

The processor 622 may generate control signals for controlling the operation of the nonvolatile memory device 610, on the basis of requests transmitted from the host, and may provide the generated control signals to the nonvolatile memory device 610 through the memory interface 624.

The memory 623 may be configured by a random access memory such as a dynamic random access memory (DRAM) or a static random access memory (SRAM). The memory 623 may store firmware to be driven by the processor 622. Also, the memory 623 may store data necessary for driving the firmware, for example, metadata. Namely, the memory 623 may operate as a working memory of the processor 622.

The memory 623 may be configured to include a data buffer for temporarily storing write data to be transmitted from the host to the nonvolatile memory device 610 or read data to be transmitted from the nonvolatile memory device 610 to the host. In other words, the memory 623 may operate as a buffer memory. The memory 623 may receive and store map data from the nonvolatile memory device 610 when the memory system 600 is booted.

The memory interface 624 may control the nonvolatile memory device 610 according to the control of the processor 622. The memory interface 624 may also be referred to as a memory controller. The memory interface 624 may provide control signals to the nonvolatile memory device 610. The control signals may include a command, an address, an operation control signal and so forth for controlling the nonvolatile memory device 610. The memory interface 624 may provide data, stored in the data buffer, to the nonvolatile memory device 610, or may store data, transmitted from the nonvolatile memory device 610, in the data buffer.

The controller 620 may further include a map cache (not illustrated) which caches map data referred to by the processor 622 among map data stored in the memory 623.

Figure 17:
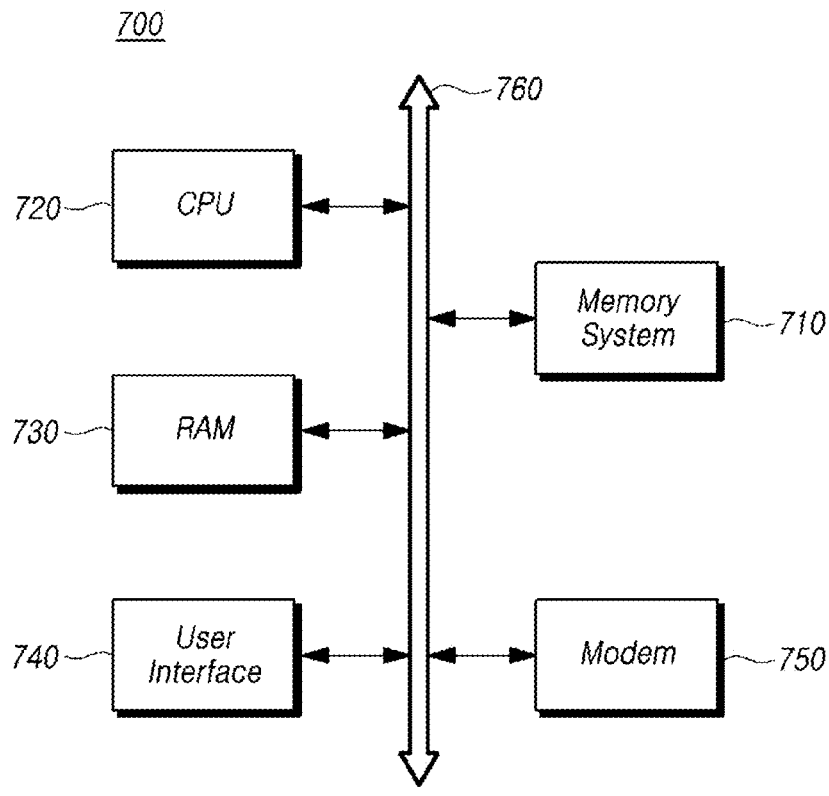
FIG. 17 is a block diagram schematically illustrating a computing system including a three-dimensional memory device according to an embodiment of the disclosure.

FIG. 17 is a block diagram schematically illustrating a computing system including a three-dimensional memory device according to an embodiment of the disclosure.

Referring to FIG. 17, a computing system 700 based on an embodiment of the disclosed technology may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to those skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

The above-described exemplary embodiment of the disclosure may be implemented not only through an apparatus and method but also through a program that realizes a function corresponding to a configuration of the exemplary embodiment of the disclosure or through a recording medium on which the program is recorded, and can be easily implemented by a person of ordinary skill in the art from the description of the foregoing exemplary embodiment.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A three-dimensional memory device comprising:
a lower electrode structure including a plurality of lower electrodes that are vertically stacked on a substrate;
a plurality of upper electrode structures disposed on the lower electrode structure, and each including a plurality of upper electrodes that are vertically stacked; and
a plurality of shunt structures passing through the plurality of upper electrode structures, and each electrically coupling the plurality of upper electrodes included in the upper electrode structure.

2. The three-dimensional memory device according to claim 1, wherein each of the plurality of upper electrode structures includes an electrode portion and a pad portion, and a width of the pad portion is larger than a width of the electrode portion.

3. The three-dimensional memory device according to claim 1, wherein the plurality of upper electrodes included in each of the plurality of upper electrode structures comprises:
a first upper electrode including a pad portion; and
a second upper electrode not including a pad portion.

4. The three-dimensional memory device according to claim 1, wherein the plurality of upper electrode structures comprises:
a first upper electrode structure including a first pad portion; and
a second upper electrode structure including a second pad portion which is adjacent to the first pad portion and is disposed from a plan view in a different column from the first pad portion,
wherein from a plan view an isolation pattern disposed between the first upper electrode structure and the second upper electrode structure has a bent portion between the first pad portion and the second pad portion.

5. The three-dimensional memory device according to claim 4, wherein
the plurality of upper electrode structures further comprises a stairway structure, and
the bent portion is disposed on a horizontal part of a step in the stairway structure.

6. The three-dimensional memory device according to claim 4, wherein
the plurality of upper electrode structures further comprises a stairway structure, and
the bent portion is disposed on a vertical part of a step in the stairway structure.

7. The three-dimensional memory device according to claim 1, wherein
the lower electrode structure includes a stairway structure, and
the plurality of upper electrode structures do not include a stairway structure.

8. The three-dimensional memory device according to claim 1, wherein upper electrodes of uppermost layers among the plurality of upper electrodes of the plurality of upper electrode structures include pad portions, and upper electrodes other than the upper electrodes of the uppermost layers do not include a pad portion.

9. A three-dimensional memory device comprising:
a lower electrode structure including a plurality of lower electrodes, which are vertically stacked on a substrate; and
a plurality of upper electrode structures disposed on the lower electrode structure, and each including a plurality of upper electrodes, which are vertically stacked and are electrically coupled to each other,
wherein some of the plurality of upper electrodes include pad portions, and other upper electrodes in the plurality of upper electrodes do not include a pad portion.

10. The three-dimensional memory device according to claim 9, wherein upper electrodes of uppermost layers among the plurality of upper electrodes of the plurality of upper electrode structures include pad portions, and upper electrodes other than the upper electrodes of the uppermost layers do not include a pad portion.

11. The three-dimensional memory device according to claim 9, wherein
the plurality of upper electrode structures includes a plurality of first upper electrode structures and a plurality of second upper electrode structures, and from a plan view, pad portions of the plurality of first upper electrode structures and pad portions of the plurality of second upper electrode structures are disposed in different columns.

12. The three-dimensional memory device according to claim 11, wherein the plurality of upper electrode structures further comprise a stairway structure, and the pad portions are disposed in the stairway structure.

13. The three-dimensional memory device according to claim 11, wherein upper electrodes including pad portions are continuously disposed in each of the plurality of first upper electrode structures, and upper electrodes including pad portions are continuously disposed in each of the plurality of second upper electrode structures.

14. A three-dimensional memory device comprising:

a substrate having a cell region and a slimming region extending from the cell region in a first direction;

a lower electrode structure including a plurality of word lines, which are vertically stacked on the substrate;

a plurality of upper electrode structures disposed on the lower electrode structure, and each including a plurality of select lines that are vertically stacked; and a plurality of shunt structures passing through the plurality of upper electrode structures, each electrically coupling the plurality of select lines of the upper electrode structure.

15. The three-dimensional memory device according to claim 14, wherein each of the plurality of upper electrode structures includes an electrode portion that extends from the cell region to the slimming region and a pad portion, which is disposed in the slimming region, and at least one of the shunt structures is disposed in the electrode portion.

16. The three-dimensional memory device according to claim 14, wherein each of the plurality of upper electrode structures includes an electrode portion that extends from the cell region to the slimming region and a pad portion, which is disposed in the slimming region, and at least one of the shunt structures is disposed in the pad portion.

17. The three-dimensional memory device according to claim 14, wherein the plurality of select lines included in each of the plurality of upper electrode structures comprises:

a first select line including a pad portion; and a second select line not including a pad portion.

18. The three-dimensional memory device according to claim 14, wherein an end of the lower electrode structure in the first direction has a stairway shape, and end portions of the plurality of upper electrode structures in the first direction have a vertical wall shape.

19. The three-dimensional memory device according to claim 14, wherein select lines of uppermost layers among the plurality of select lines of the plurality of upper electrode structures include pad portions, and select lines other than the select lines of the uppermost layers do not include a pad portion.

20. The three-dimensional memory device according to claim 14, wherein the plurality of upper electrode structures include a plurality of first upper electrode structures and a plurality of second upper electrode structures, each of the plurality of first upper electrode structures and the plurality of second upper electrode structures includes a plurality of pad portions, in a plan view, the plurality of pad portions in each of the plurality of first upper electrode structures are continuously disposed in the first direction, and in a plan view, the plurality of pad portions in each of the plurality of second upper electrode structures are continuously disposed in the first direction.

\* \* \* \* \*